(12) United States Patent
Das Mahapatra et al.

(10) Patent No.: US 12,166,004 B2
(45) Date of Patent: Dec. 10, 2024

(54) SOLDER THERMAL INTERFACE MATERIAL (STIM) WITH DOPANT

(71) Applicant: Intel Corporation, Santa Clara, CA (US)

(72) Inventors: Susmriti Das Mahapatra, Tempe, AZ (US); Bamidele Daniel Falola, Chandler, AZ (US); Amitesh Saha, Phoenix, AZ (US); Peng Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1053 days.

(21) Appl. No.: 16/406,593

(22) Filed: May 8, 2019

(65) Prior Publication Data

US 2020/0357764 A1 Nov. 12, 2020

(51) Int. Cl.
*H01L 23/00* (2006.01)
*H01L 23/373* (2006.01)

(52) U.S. Cl.
CPC ............... *H01L 24/29* (2013.01); *H01L 24/32* (2013.01); *H01L 23/3736* (2013.01); *H01L 2224/29109* (2013.01); *H01L 2224/29113* (2013.01); *H01L 2224/29124* (2013.01); *H01L 2224/29139* (2013.01); *H01L 2224/29157* (2013.01); *H01L 2224/29186* (2013.01); *H01L 2224/32503* (2013.01)

(58) Field of Classification Search
CPC ..... H01L 23/3736; H01L 23/42; H01L 24/29; H01L 2224/29109; H01L 2224/32503; H01L 2224/29209; H01L 2224/83191; H01L 2224/8381; H01L 23/34–4735; H01L 2224/37109; H01L 2224/13109; H01L 2224/13157; H01L 2224/29157
See application file for complete search history.

(56) References Cited

U.S. PATENT DOCUMENTS

| 2,596,486 | A | 5/1952 | Jaffee et al. |
| 4,603,090 | A | 7/1986 | Mizuhara |
| 6,724,078 | B1 * | 4/2004 | Sur .......... H01L 23/42 |
| | | | 257/E23.09 |
| 6,757,170 | B2 | 6/2004 | Lee et al. |
| 6,790,709 | B2 * | 9/2004 | Dias ....... H01L 23/562 |
| | | | 257/E29.022 |

(Continued)

FOREIGN PATENT DOCUMENTS

| CN | 106660153 A | * 5/2017 | .......... B23K 1/0016 |
| EP | 1998370 A2 | 12/2008 | |
| JP | H05198709 | * 8/1993 | |

OTHER PUBLICATIONS

Intermetallics in Soldering, Indium Corporation, Eric Bastow, Nov. 11, 2011 (Year: 2011).*

(Continued)

*Primary Examiner* — David A Zarneke
(74) *Attorney, Agent, or Firm* — Akona IP PC

(57) ABSTRACT

Embodiments may relate to a microelectronic package comprising that includes a solder thermal interface material (STIM). The STIM may include indium and a dopant material which may provide a number of benefits to the STIM. The STIM may physically and thermally couple a die and an integrated heat spreader (IHS). Other embodiments may be described or claimed.

20 Claims, 8 Drawing Sheets

(56) References Cited

U.S. PATENT DOCUMENTS

| | | | | |
|---|---|---|---|---|
| 6,812,548 B2* | 11/2004 | Dias | | H01L 23/3677 |
| | | | | 257/E29.022 |
| 6,848,610 B2* | 2/2005 | Liu | | B23K 3/0638 |
| | | | | 228/56.3 |
| 7,312,527 B2* | 12/2007 | Sane | | H01L 24/32 |
| | | | | 438/122 |
| 7,663,242 B2 | 2/2010 | Lewis et al. | | |
| 7,748,440 B2* | 7/2010 | Michel | | H01L 23/42 |
| | | | | 165/185 |
| 7,755,184 B2* | 7/2010 | Macris | | H01L 23/42 |
| | | | | 257/E23.101 |
| 7,813,133 B2 | 10/2010 | Iijima et al. | | |
| 7,999,394 B2* | 8/2011 | Too | | H01L 23/3736 |
| | | | | 257/713 |
| 8,409,929 B2 | 4/2013 | Renavikar et al. | | |
| 8,513,800 B2* | 8/2013 | Kurita | | H01L 23/433 |
| | | | | 257/E21.536 |
| 8,925,793 B2* | 1/2015 | Arunasalam | | H01L 24/29 |
| | | | | 228/56.3 |
| 8,951,846 B2* | 2/2015 | Krishnan | | H01L 23/34 |
| | | | | 438/122 |
| 9,468,136 B2* | 10/2016 | Ross | | H01L 24/29 |
| 10,128,123 B2* | 11/2018 | Majeed | | H01L 24/13 |
| 10,643,924 B1 | 5/2020 | Shen | | |
| 11,817,364 B2* | 11/2023 | Swaminathan | | H01L 23/3736 |
| 2003/0077478 A1* | 4/2003 | Dani | | H01L 24/29 |
| | | | | 428/673 |
| 2003/0209801 A1 | 11/2003 | Hua et al. | | |
| 2004/0262740 A1 | 12/2004 | Matayabas et al. | | |
| 2004/0262766 A1* | 12/2004 | Houle | | H01L 23/04 |
| | | | | 257/E23.087 |
| 2005/0040518 A1 | 2/2005 | Brandenburg et al. | | |
| 2005/0263879 A1* | 12/2005 | Michel | | H01L 23/42 |
| | | | | 257/E23.087 |
| 2006/0060639 A1* | 3/2006 | Byrne | | H05K 3/3436 |
| | | | | 228/248.1 |
| 2006/0227510 A1 | 10/2006 | Fitzgerald et al. | | |
| 2007/0117270 A1 | 5/2007 | Renavikar et al. | | |
| 2007/0145546 A1 | 6/2007 | Lewis et al. | | |
| 2007/0164424 A1* | 7/2007 | Dean | | H01L 23/4275 |
| | | | | 257/E23.087 |
| 2008/0023665 A1 | 1/2008 | Weiser et al. | | |
| 2008/0067671 A1 | 3/2008 | Kurita et al. | | |
| 2008/0122066 A1 | 5/2008 | Ishii | | |
| 2008/0264504 A1* | 10/2008 | Gossett | | F16K 47/08 |
| | | | | 137/625.33 |
| 2008/0293188 A1* | 11/2008 | Hua | | H01L 23/42 |
| | | | | 257/E23.101 |
| 2010/0112360 A1* | 5/2010 | Delano | | H01L 23/4275 |
| | | | | 205/183 |
| 2010/0129648 A1 | 5/2010 | Xu et al. | | |
| 2010/0319898 A1 | 12/2010 | Underwood et al. | | |
| 2012/0153448 A1 | 6/2012 | Ihara et al. | | |
| 2012/0305632 A1 | 12/2012 | Ross et al. | | |
| 2013/0105975 A1* | 5/2013 | Hussain | | H01L 23/24 |
| | | | | 257/734 |
| 2014/0167246 A1 | 6/2014 | Ihara et al. | | |
| 2014/0262192 A1 | 9/2014 | Boday et al. | | |
| 2015/0279761 A1 | 10/2015 | Bet-Shliemoun | | |
| 2016/0037649 A1 | 2/2016 | Barber | | |
| 2016/0148894 A1 | 5/2016 | Zhu et al. | | |
| 2017/0086320 A1 | 3/2017 | Barber | | |
| 2017/0186887 A1 | 6/2017 | Hahn et al. | | |
| 2017/0197281 A1 | 7/2017 | Choudhury et al. | | |
| 2017/0321100 A1 | 11/2017 | Zhang et al. | | |
| 2018/0145006 A1 | 5/2018 | Na et al. | | |
| 2018/0358280 A1 | 12/2018 | Gandhi et al. | | |
| 2019/0393121 A1* | 12/2019 | Swaminathan | | H01L 24/17 |
| 2020/0006192 A1* | 1/2020 | Li | | H01L 23/42 |
| 2020/0020609 A1 | 1/2020 | Yamaura et al. | | |
| 2020/0381332 A1 | 12/2020 | Saha et al. | | |
| 2020/0381334 A1* | 12/2020 | Visvanathan | | H01L 23/3675 |
| 2020/0395269 A1 | 12/2020 | Dubey et al. | | |

OTHER PUBLICATIONS

"SMIC Lead Free Solder Catalog", Senju Metal Industry Co., Ltd., 2018, 12 pages.

The wetting of alumina by copper alloyed with titanium and other elements, Journal of Materials Science 15 (1980) 2197-2206 (Year: 1980).

\* cited by examiner

SOLDER THERMAL INTERFACE MATERIAL (STIM) WITH DOPANT

BACKGROUND

Heating and cooling of a microelectronic package that includes a solder thermal interface material (STIM) may result in formation of an intermetallic layer (IMC), resulting in an increase of porosity of the interface between the STIM and a package element to which the STIM is physically or thermally coupled. This increased porosity may cause reduction in thermal performance of the microelectronic packages.

DETAILED DESCRIPTION

Figure 1:
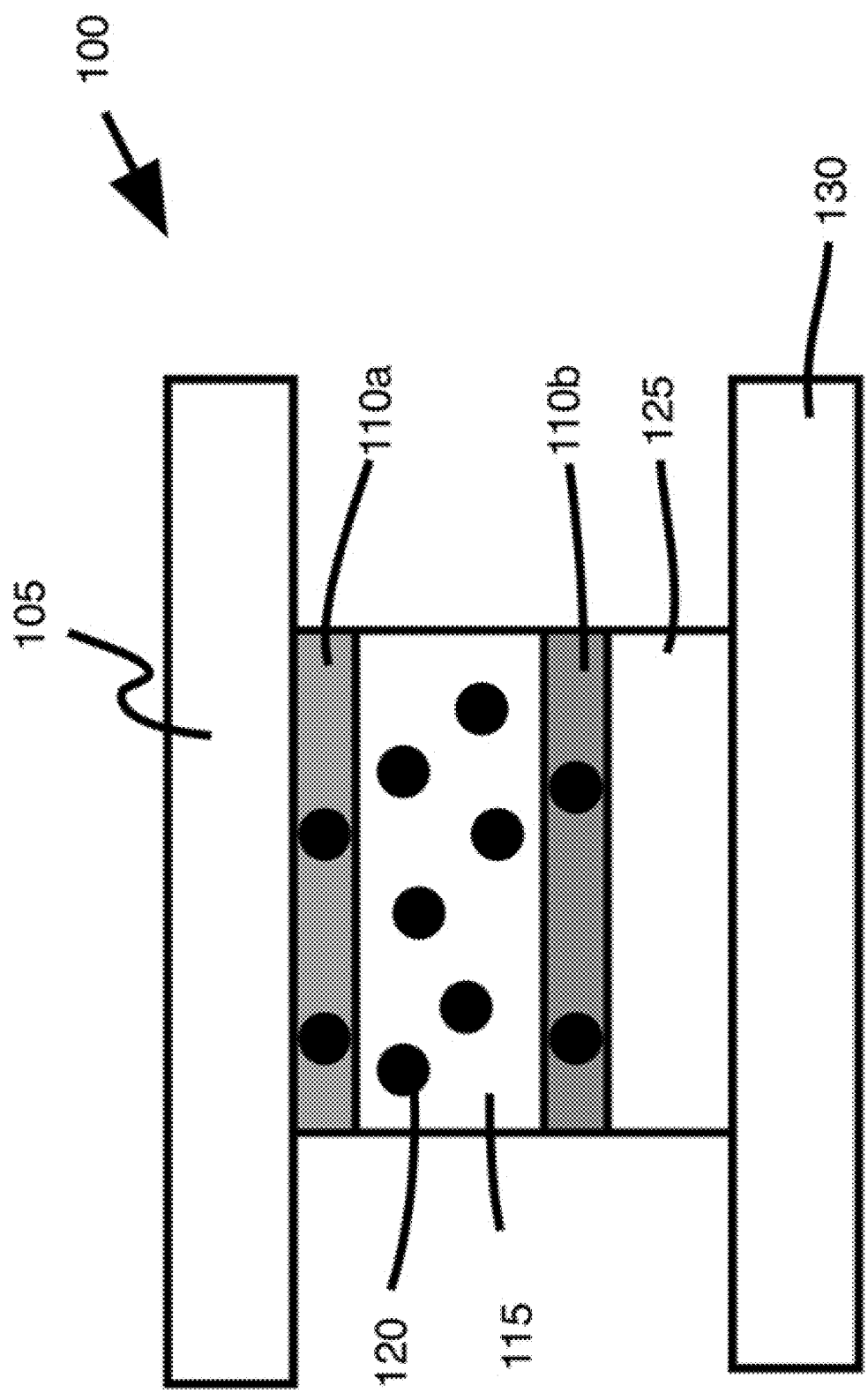
FIG. 1 depicts a simplified example of a microelectronic package with a doped STIM, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabric.

In some embodiments, the package discussed herein may also be referred to as a "semiconductor package." For the sake of consistency, the term "microelectronic package" will be used herein. Additionally, in some embodiments the integrated heat spreader (IHS) may be referred to as a "lid" or an "IHS lid." However, for the sake of consistency herein, the term IHS will be used.

In many embodiments, one role of thermal interface materials such as a STIM is to dissipate heat generated by integrated circuits to a heat sink. Solders with high liquidus temperatures (i.e., the temperature at which a material transitions to a liquid state) and high thermal conductivity may be used in a STIM to remove heat from microelectronic packages subjected to high temperature reflow processes such as ball grid array (BGA) reflow as described above. To achieve good wettability and bond formation, the STIM may be heated about its liquidus temperature. This may allow the STIM to both physically and thermally couple with the die and the IHS to reduce or minimize interfacial resistance. However when the STIM is heated above its liquidus temperature, the STIM may form an IMC with a material of the die or the IHS, and the composition and thickness of the IMC may affect the reliability performance of the package.

As one example, multiple thermal cycles of a microelectronic package may cause an IMC to grow within the package and increase porosity of the interface between the STIM and an IHS to which the STIM is physically or thermally coupled. One example of such a thermal cycle may include a reflow process wherein the microelectronic package (or element thereof) is coupled with a substrate by a BGA. In this embodiment, a solder ball may be positioned between the microelectronic package (or element thereof) and the substrate and reflow may be performed to cause the solder ball to physically, thermally, or electronically adhere the substrate and the microelectronic package (or element thereof).

Generally, the resultant IMC may include an intermixture of the material of the STIM with a metallic compound of the IHS or the die. This increased porosity may result in interfacial degradation and cause reduction in thermal performance of the microelectronic packages. Additionally, reflowing the solder material of the STIM may lead to de-wetting of the STIM from its own IMC, which may affect voiding performance of the STIM.

Embodiments herein may relate to the use of dopants in the STIM to improve the wettability of the STIM to its own IMC, inhibit the growth of the IMC, and improve IMC morphology. As used herein, "dopant" may refer to a material (such as those described with respect to various embodiments) that is introduced into a STIM material to alter the properties of the STIM material as described herein. Additionally, "wettability" may refer to the ability of molten STIM to maintain contact with the IMC resulting from intermolecular interactions between the two. Each of these results may facilitate additional thermal processes such as reflow without impacting the thermal performance of the packages. The STIM may include, for example, indium or some other suitable solder material. The dopants may include materials such as silver, bismuth, cobalt, cerium oxide (CeO2), aluminum, or some other similar material. In addition to the advantages discussed above that such dopants may provide, the dopants may reduce the "creeping" of the STIM and IMC, which may refer to the tendency of the material to deform under physical stress, thermal stress, or some other type of stress. The dopants may also help slow down growth of the IMC during thermal cycling, therefore providing improved reliability.

Generally, the STIM may include less than approximately 5% by weight of the dopant material. In embodiments where multiple dopant materials are used (e.g., silver and bismuth), the STIM may include less than approximately 5% by weight of the combined dopant materials. However, in other embodiments the STIM may have less than approximately 5% by weight of each of the dopants, or the combined dopants may add up to less than approximately 10% by weight (e.g., approximately 9% bismuth, approximately 1% silver), etc. It will be understood that these ranges are intended only as examples and in other embodiments there may be different combinations of dopants, and the STIM may include different amounts thereof.

As specific examples of the benefits of the various dopants, dopants such as bismuth, silver, aluminum, etc. may improve the wettability of indium to its own IMC, and hence reduce voiding within the IMC. In some embodiments, bismuth may also reduce creeping of the STIM and IMC, which may help in thermal cycling and improved reliability performance of the resultant microelectronic package.

In some embodiments, cobalt or CeO2 may inhibit IMC growth during thermal cycling such as BGA reflow. As an example, and as will be described in further detail below, CeO2 may inhibit the growth of IMC due to accumulation of CeO2 particles of the grain boundary of the IMC layers, which may slow grain boundary diffusion. Therefore, an increase in the amount of absorbed CeO2 particles may result in a decrease in the surface energy of the IMC crystal plane, and consequently decrease the growth rate of the IMC.

As another example, cobalt may inhibit IMC growth during thermal cycling by acting as a diffusion barrier. More specifically, cobalt may act as a grain refiner. That is, grain boundaries in the IMC may act as pinning points to prevent dislocation movement within the IMC. The cobalt may make the grains of the IMC smaller, thereby increasing the number of grain boundaries and increasing the number of pinning points with the IMC. This diffusion may hinder the onset of plasticity and increase yield strength of the STIM and the IMC because, generally, yield strength of the IMC may be considered to be inversely proportional to the diameter of the grains within the IMC.

FIG. 1 depicts a simplified example of a microelectronic package 100 with a doped STIM, in accordance with various embodiments. It will be understood that the depiction of the microelectronic package 100 is intended as one example depiction for the sake of illustration and discussion of elements herein. Unless specifically stated otherwise, the specific relative sizes or dimensions of the various elements should not be interpreted as dictated based on the dimensions depicted in FIG. 1 or other Figures herein. For example, in real world embodiments the STIM may be significantly thinner, with respect to the die or IHS, than depicted in FIG. 1. Similarly, in real world embodiments the dopant may have a diameter that is significantly smaller, or less circular, than depicted in FIG. 1. It will also be understood that FIG. 1, and other Figures herein, are intended as simplified examples and other real world embodiments may have more or fewer elements than depicted in the specific Figures, elements of a different shape or size, elements in a different configuration, etc. For example, additional active or passive elements, layers, circuitry, etc. may be present at different areas or portions of the microelectronic package 100 or other Figures herein. Other variations may likewise be present in various embodiments.

The microelectronic package 100 may include a die 125 coupled with a package substrate 130. The die 125 may be or include, for example, a processor such as a central processing unit (CPU), general processing unit (GPU), a core of a distributed processor, or some other type of processor. Alternatively, the die 125 may be include a memory such as a double data rate (DDR) memory, a non-volatile memory (NVM), a volatile memory, a read-only memory (ROM), or some other type of memory or die. In some embodiments the die 125 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal. In some embodiments the die 125 may include one or more passive components such as capacitors, resistors, etc. The various active or passive components may be positioned within, partially within, or on the surface of the die 125.

The package substrate 130 may be, for example, considered to be a cored or coreless substrate. The package substrate 130 may include one or more layers of a dielectric material which may be organic or inorganic. The package substrate 130 may further include one or more conductive elements such as vias, pads, traces, microstrips, striplines, etc. The conductive elements may be internal to, or on the surface of, the package substrate. Generally, the conductive elements may allow for the routing of signals through the package substrate 130, or between elements that are coupled to the package substrate 130. It will be understood that although the package substrate 130 is discussed herein as an element of the microelectronic package 100, in other embodiments the package substrate 130 may be considered to be an element separate from the microelectronic package 100 to which the microelectronic package 100 is coupled. For the sake of ease of description herein, the package substrate 130 will generally be discussed as an element of the microelectronic package 100 without taking a specific position on this possible difference in naming convention.

The microelectronic package 100 may further include an IHS 105. The IHS 105 may be formed of a thermally conductive material such as nickel, copper, combinations thereof, or some other material. For example, in some embodiments the IHS 105 may include a layer of nickel at a side of the IHS 105 facing the package substrate 130, and a layer of copper at an opposite side of the IHS 105. In some embodiments, the copper portion of the IHS 105 may be configured to couple with a heat sink, heat spreader, or some other thermal solution. In this manner, the IHS 105 may receive thermal energy from the die 125 (to which it is thermally coupled) and distribute the thermal energy away from the die 125 to the thermal solution.

The IHS 105 may be thermally or physically coupled with the die 125 by a STIM 115. As described above, the STIM may be or include a material such as indium or some other thermally-appropriate solder material. However, as described above, during a thermal cycling process such as BGA reflow, the STIM 115 may combine with a material of the IHS 105 or the die 125 to form IMC layers 110a and 110b (collectively, IMC layers 110). For example, if the STIM 115 is formed of indium as described above, the indium of the STIM 115 may combine with the nickel of the IHS 105 to form a nickel-indium IMC layer 110a, which may present one or more of the disadvantages of the IMC described above with respect to reliability, wettability, etc. Additionally, if the STIM 115 is formed of indium and the die 125 is formed of silicon with a thin layer of metallization (e.g., gold, silver, etc.), then the IMC 110b may be a binary/ternary phase of gold, silver, and the material of the STIM (e.g., indium and a dopant material as described herein).

In order to provide one or more of the advantages described above with respect to the IMCs, the STIM 115 may include a dopant material 120. As noted above, the dopant material may be or include bismuth, $CeO_2$, cobalt, aluminum, silver, combinations thereof, or some other dopant material. Additionally, as noted above in some embodiments the STIM 115 may include up to approximately 5% by weight of the dopant material, whereas in other embodiments the STIM 115 may include an additional amount of dopant materials. The specific amount of dopant material 120 may be based on factors such as the particular use case to which the microelectronic package 100 will be put, the type(s) of dopant material(s) selected, the size or design parameters of the microelectronic package 100, etc.

As can be seen in FIG. 1, when the IMCs 110 are formed, then the IMCs 110 may include at least a portion of the dopant material 120. Specifically, because the dopant material 120 is intermixed with the STIM 115, when the IMCs are formed the STIM/dopant material may intermix with the material of the IHS 105 or the die 225. As a result, the dopant material 120 in the IMCs 110 may produce one or more of the above-described advantages.

Figure 2:
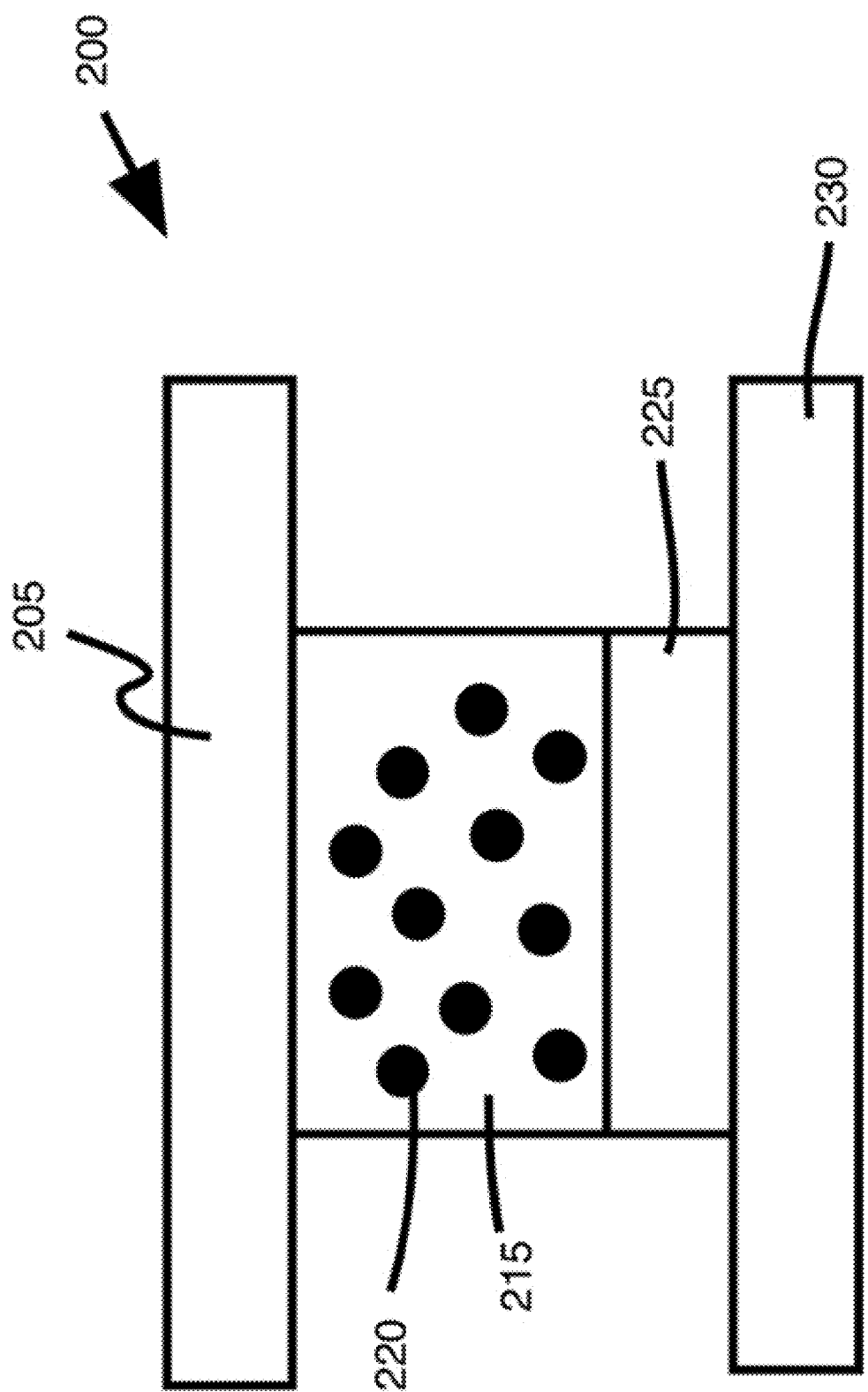
FIG. 2 depicts a simplified example of a configuration of a microelectronic package with a STIM and a dopant material prior to reflow, in accordance with various embodiments.

FIG. 2 depicts a simplified example of a configuration of a microelectronic package 200 with a STIM and a dopant material prior to reflow or some other thermal cycling process, in accordance with various embodiments. Specifically, the microelectronic package 200 may include an IHS 205, a die 225, and a package substrate 230, which may be respectively similar to, and share one or more characteristics of, IHS 105, die 125, and package substrate 130.

The microelectronic package 200 may further include a STIM 215 which may include a dopant material 220, which may be respectively similar to, and share one or more characteristics of, STIM 115 and dopant material 120. In some embodiments, the STIM 215 or the STIM 215 and the dopant material 220 may be referred to as a "preform." That is, the STIM 215 or the STIM 215 and dopant material 220 may be constructed to have a specific shape or structure prior to thermal cycling. The shape or structure of the preform may be selected based on factors such as design characteristics of the microelectronic package 200, the thermal cycling process that is intended, the desired shape or structure of the STIM within the microelectronic package subsequent to thermal cycling, etc.

More generally, prior to the thermal cycling process, the STIM 215 may already include the dopant material 220 intermixed therein. When the thermal cycling process is performed, the STIM 215 and dopant material 220 may combine with the material of the IHS 205 or the die 225 to form an IMC such as IMCs 110, wherein the dopant material 220 may produce one or more of the advantages discussed above.

Figure 3:
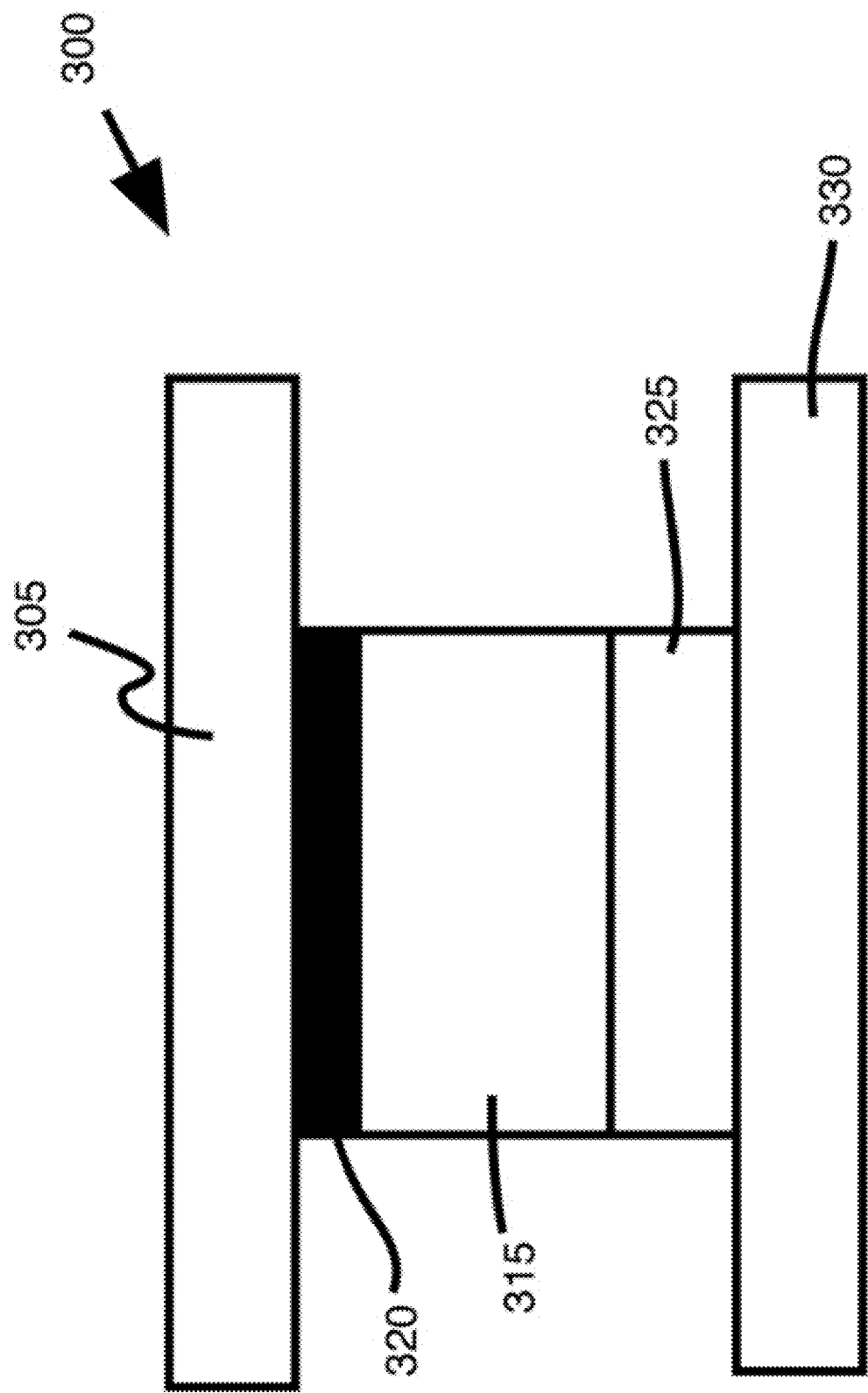
FIG. 3 depicts an alternative simplified example of a configuration of a microelectronic package with a STIM and a dopant material prior to reflow, in accordance with various embodiments.

FIG. 3 depicts an alternative simplified example of a configuration of a microelectronic package 300 with a STIM and a dopant material prior to reflow or some other thermal cycling process, in accordance with various embodiments. Specifically, the microelectronic package 300 may include an IHS 305, a die 325, and a package substrate 330, which may be respectively similar to, and share one or more characteristics of, IHS 105, die 125, and package substrate 130.

The microelectronic package 300 may further include a STIM 315, which may be similar to, and share one or more characteristics of, STIM 115. The microelectronic package 300 may further include a dopant material 320. However, in contrast to the dopant material 220 of FIG. 2, the dopant material 320 may be present in the microelectronic package 300 as a layer of the dopant material. Similarly to FIG. 2, the STIM 315 or the STIM 315 and dopant material 320 may be referred to as a "STIM preform." When the thermal cycling process is performed, the dopant material 320 may intermix with the STIM 315 to form a STIM with an intermixed dopant material such as STIM 115 and dopant material 120. Additionally, the dopant material 320 may intermix with the resultant IMC to form an IMC that includes a dopant material such as IMCs 110.

It will be understood that FIG. 3 is intended as an example of one embodiment of the layer of dopant material 320. In some embodiments, the dopant material 320 may additionally or alternatively be located between the STIM 315 and the die 325. In some embodiments the dopant material 320, prior to thermal cycling, may include one or more binders, fixers, or agents that may help retain the dopant material as a layer prior to the reflow. Additionally, and as discussed in greater detail below, in some embodiments the STIM 315 and the dopant material 320 may have different shapes, sizes, or widths. For example, in some embodiments the dopant material 320 may not be generally contiguous along the length or width the STIM 315, or the dopant material 320 may be wider/narrower/shorter/longer/etc. than the STIM 315 as measured with respect to the face of the STIM 315 on which the dopant material 320 is placed.

Figure 4:
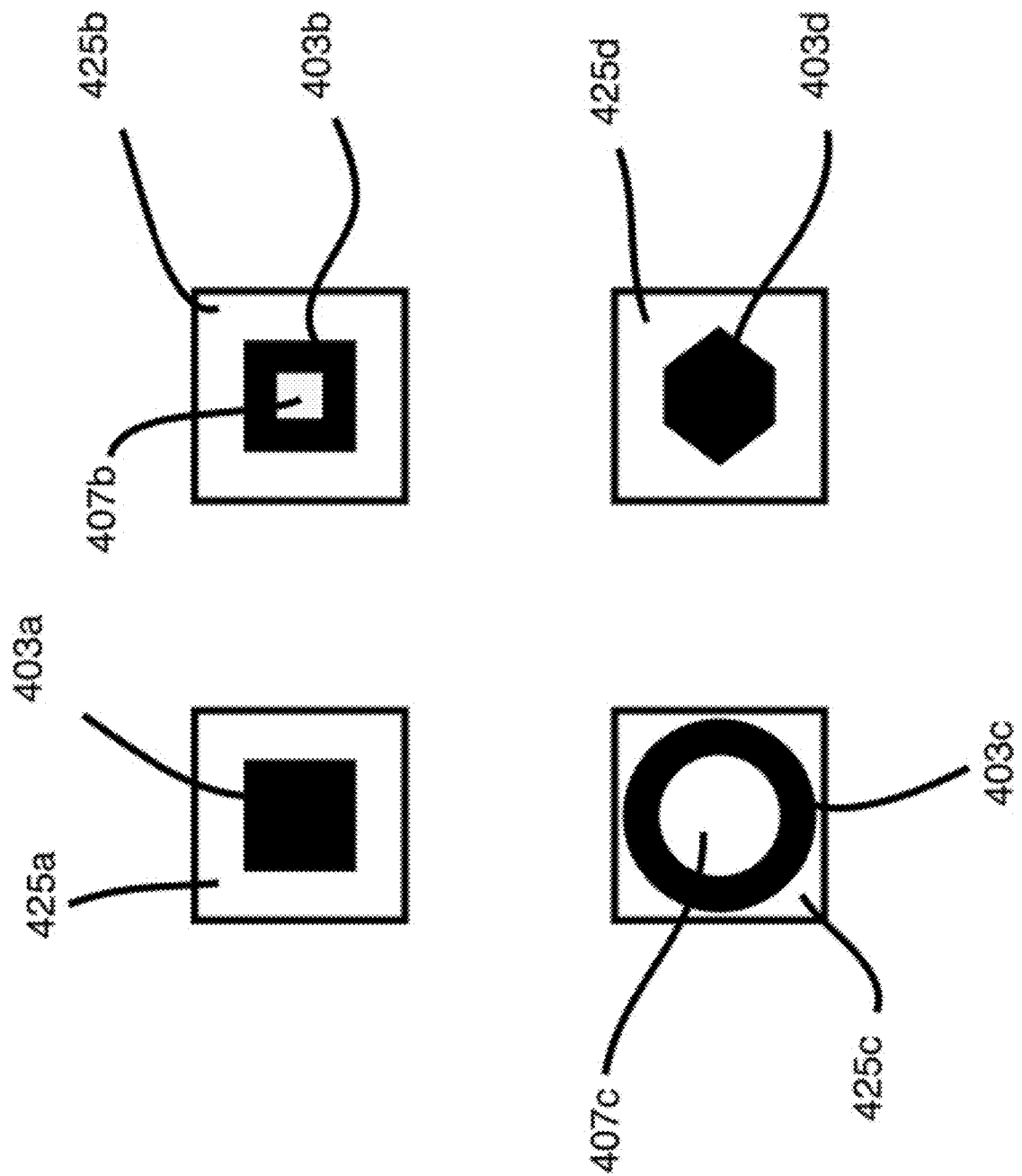
FIG. 4 depicts a top-down simplified example of various configurations of a die and a STIM preform that includes a dopant material, in accordance with various embodiments.

FIG. 4 depicts a top-down simplified example of various configurations of a die and a STIM preform that includes a dopant material, in accordance with various embodiments. Specifically, FIG. 4 may depict a top-down view of a variety of dies 425*a*, 425*b*, 425*c*, and 425*d* (collectively referred to as "dies 425"). The dies 425 may be similar to, and share one or more characteristics of, die 125 or some other die herein. The dies 425 may include a variety of STIM preforms 403*a*, 403*b*, 403*c*, and 403*d* (collectively "STIM preforms 403") positioned thereon. The STIM preforms 403 may be similar to, for example, the STIM preforms discussed above with respect to FIGS. 2 and 3.

In some embodiments the STIM preforms 403 may be generally unitary or uninterrupted pieces of material such as depicted in STIM preforms 403*a* and 403*d*. In other embodiments, the STIM preforms 403 may have one or more cavities such as cavities 407*b* and 407*c*. It will be understood, however, that these specific configurations are intended as examples. In other embodiments, the STIM preforms may take a different shape such as triangular, rectangular, etc. In some embodiments the dies 425 may include a plurality of STIM preforms placed thereon, rather than just a singular STIM preform as depicted in FIG. 4. In embodiments such as FIG. 3 wherein the STIM preform may include a layer of STIM material and a layer of dopant material, the configuration of the STIM material may different than the configuration of the dopant material with respect to shape, dimensions, thickness, etc. That is, in some embodiments the die may be one shape, the STIM may be another shape, and the dopant material may be yet another shape. Similarly to the variations discussed above, these variations may be based on factors such as use chases, the desired dopant disbursement within the STIM or IMC, the thermal cycling process to be used, etc.

Figure 5:
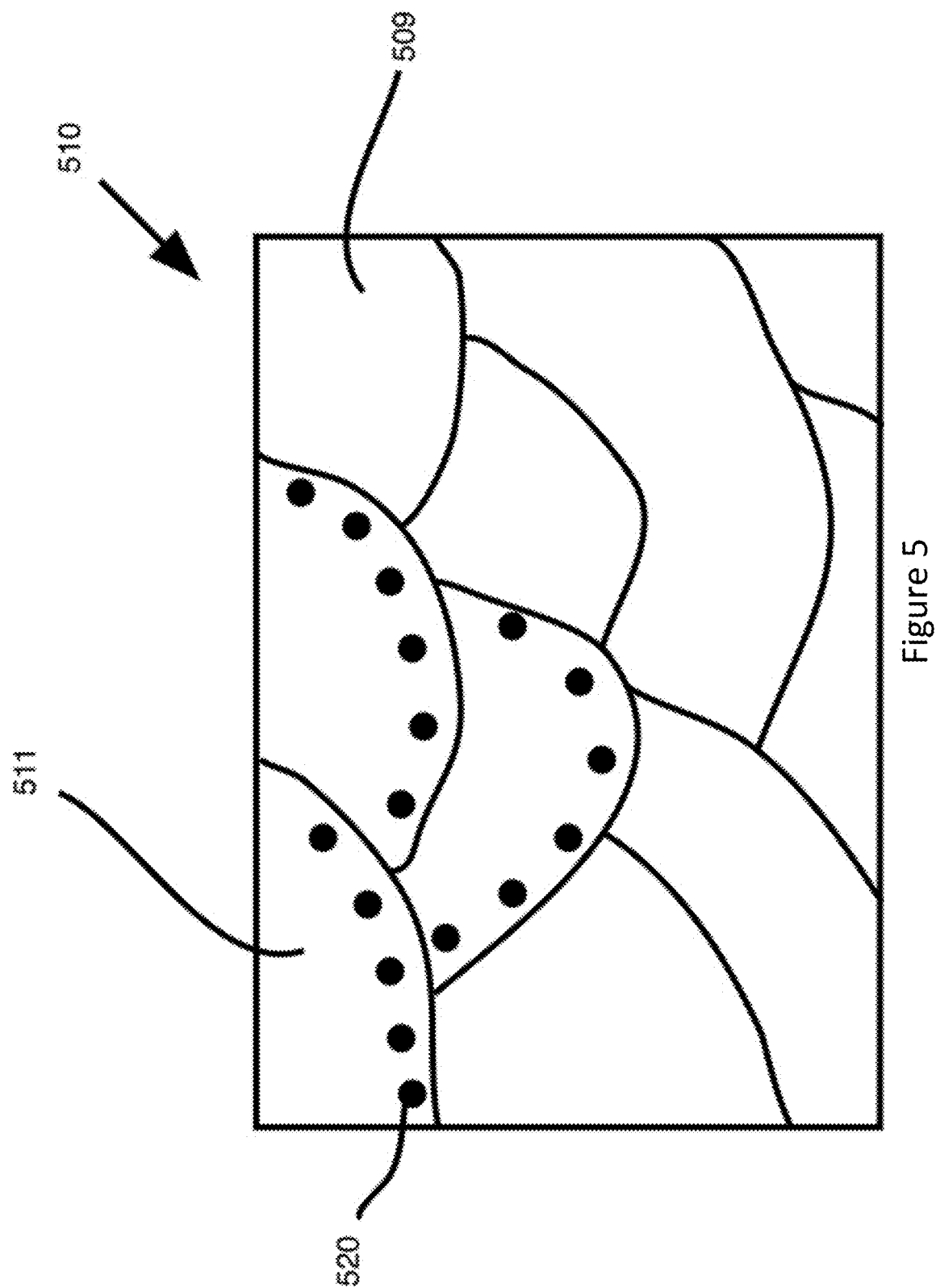
FIG. 5 depicts an example of IMC grain boundaries in the presence of a dopant, in accordance with various embodiments.

As noted above, the growth of IMC layers may be inhibited when the dopant material is CeO2 due to accumulation of the CeO2 particles at the grain boundary of the IMC layers. FIG. 5 depicts an example of IMC grain boundaries in the presence of a dopant, in accordance with various embodiments. Specifically, FIG. 5 depicts an IMC 510, which may be similar to and share one or more characteristics of IMC 110. The IMC 510 may include a plurality of grains 511 and 509. For the sake of completeness, grains 509 are depicted without a dopant material. However, grains 511 may include a dopant material 520 at the boundary of the various grains 511 as shown. The dopant material 520 may be similar to dopant material 120 discussed herein and, more specifically, the dopant material 520 may include CeO2. This dopant material 520 may result in a decrease in the surface energy of the crystal plane, and consequently decrease the growth rate of the IMC 510.

Figure 6:
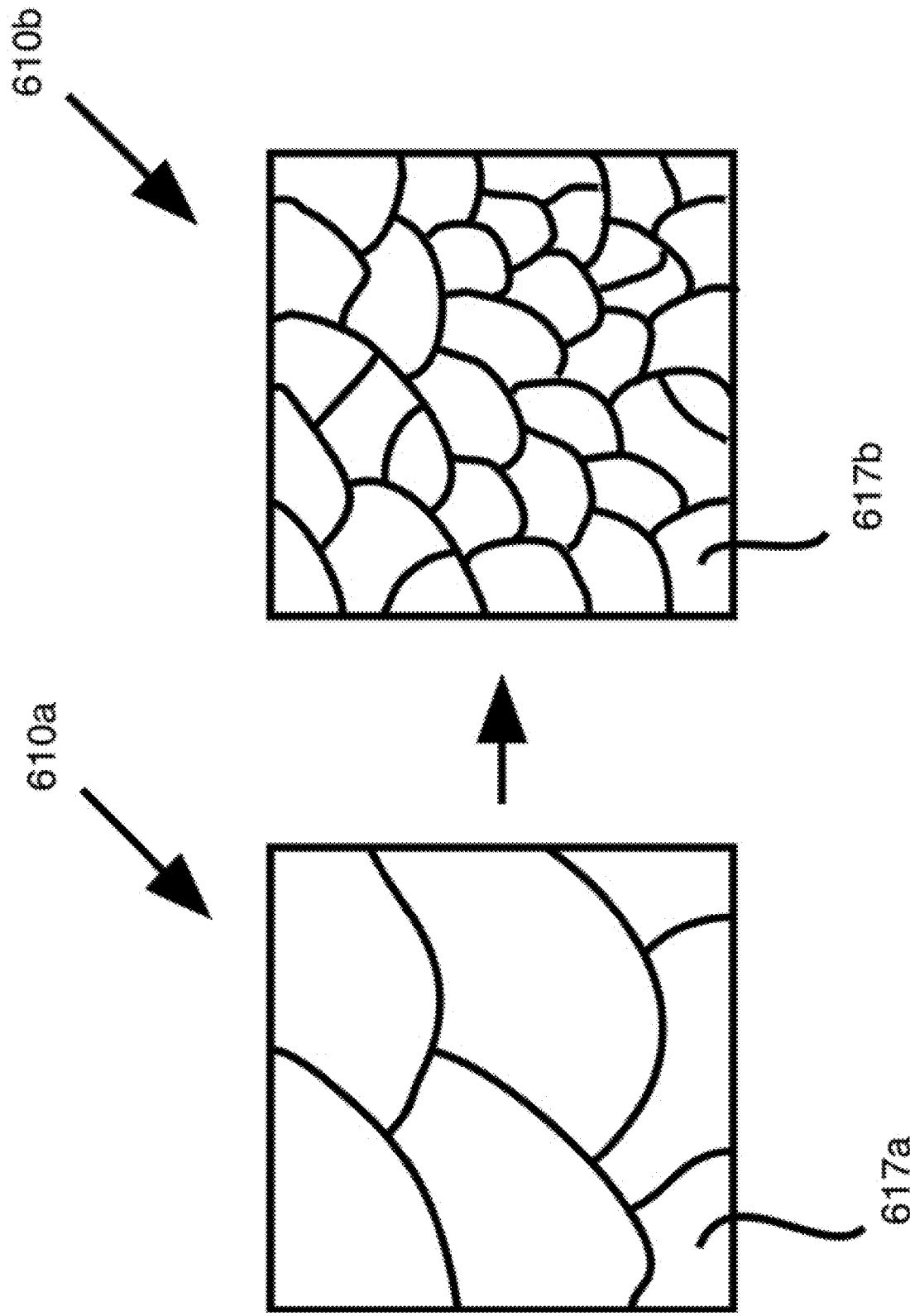
FIG. 6 depicts an example of IMC grain size in the presence of a dopant, in accordance with various embodiments.

Additionally, as noted above, cobalt may act as a grain refiner within an IMC. FIG. 6 depicts an example of IMC grain size in the presence of a dopant, in accordance with various embodiments. More specifically, FIG. 6 depicts two examples of an IMC 610*a* and 610*b*, which may be respectively similar to IMC 110. IMC 610*a* may depict an example without the addition of a dopant material such as cobalt. The IMC 610*a* include a plurality of grains 617*a*. by contrast, IMC 610*b* may depict an example with a dopant material such as cobalt. The IMC 610*b* may include a plurality of grain 617*b*. As can be seen in FIG. 6, the grains 617*b* may be significantly smaller than the grains 617*a*. This size different may be based on the presence of the cobalt and its action as a grain refiner.

Figure 7:
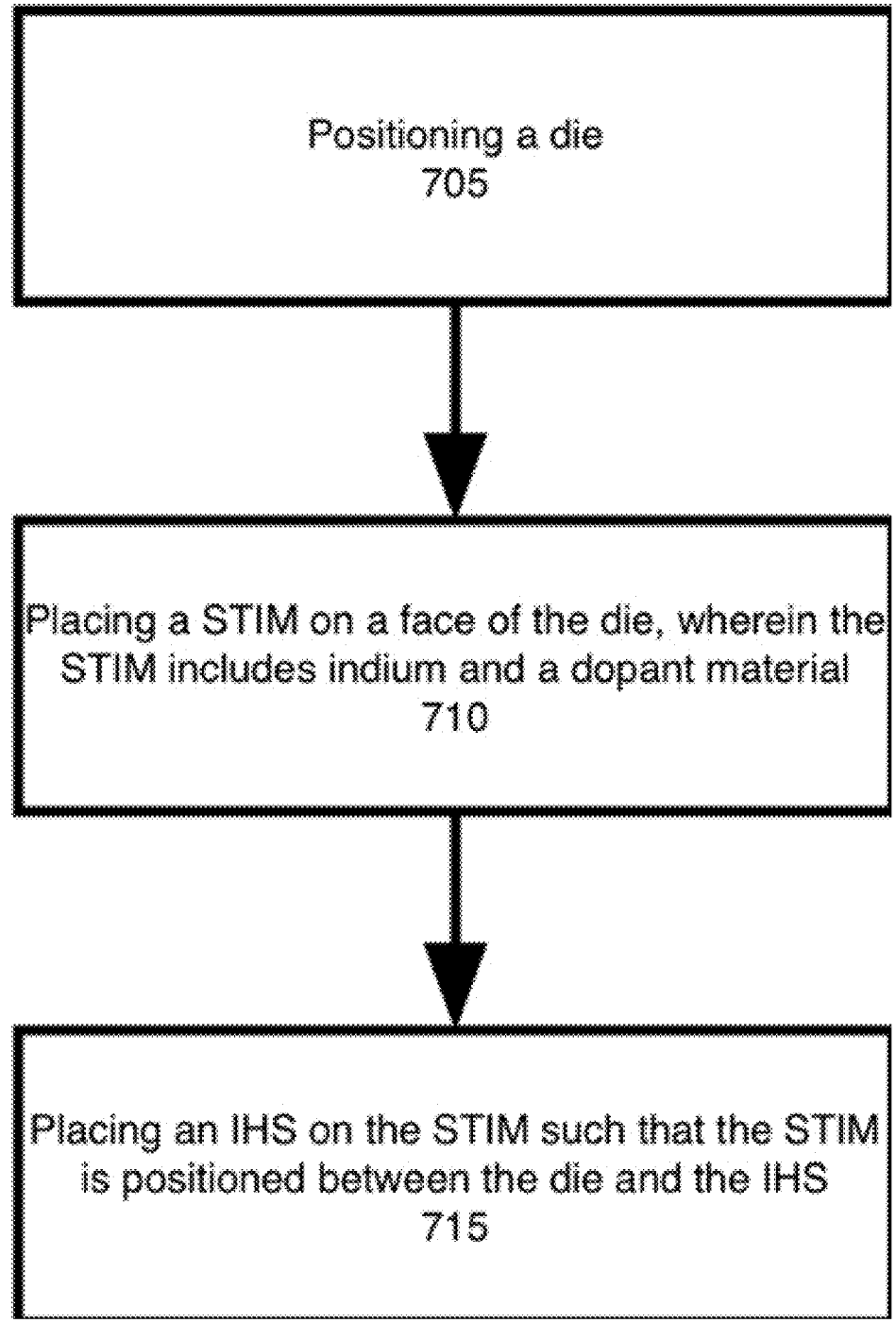
FIG. 7 depicts an example technique of forming a microelectronic package that includes a doped STIM, in accordance with various embodiments.

FIG. 7 depicts an example technique of forming a microelectronic package that includes a doped STIM, in accordance with various embodiments. Generally, the technique may be described herein with respect to aspects of FIG. 2 or 3, however it will be understood that the technique may be applicable to other embodiments as well, in whole or in part, with or without modification. It will be understood that this technique is intended as an example only, and other techniques may include more elements, fewer elements, elements in a different order, elements occurring concurrently with one another, etc.

The technique may include positioning, at 705, a die. The die may be, for example, die 225 or 325. In some embodiments the die may be positioned on a package substrate such as package substrate 230 or 330, whereas in other embodiments the die may be positioned on a carrier or some other element.

The technique may further include placing, at 710, a STIM on a face of the die. In some embodiments, the STIM may be a STIM preform as discussed above. Specifically, the STIM may include indium and a dopant material. For example, the STIM may be STIM 215 with dopant material 220. In other embodiments the STIM may be STIM 315 with dopant material 320. In other embodiments the STIM may be one of STIM preforms 403.

The technique may further include placing, at 715, an IHS on the STIM such that the STIM is positioned between the die and the IHS. The IHS may be similar to, for example, IHS 205 or 305.

Figure 8:
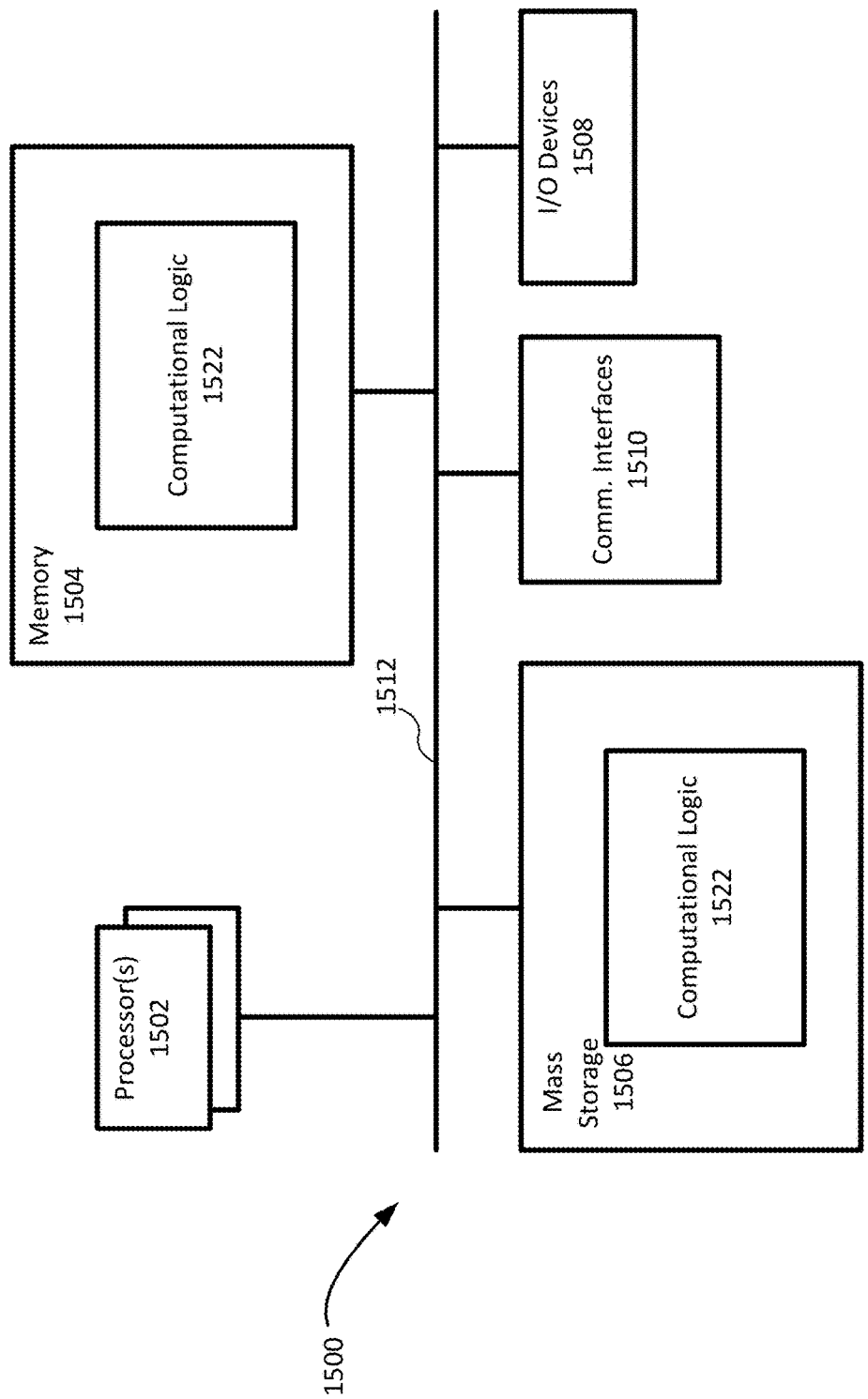
FIG. 8 illustrates an example device that may use various embodiments herein.

FIG. 8 illustrates an example computing device 1500 suitable for use with microelectronic package 100, in accordance with various embodiments. Specifically, in some embodiments, the computing device 1500 may include one or more of microelectronic package 100 therein.

As shown, computing device 1500 may include one or more processors or processor cores 1502 and system memory 1504. For the purpose of this application, including the claims, the terms "processor" and "processor cores" may be considered synonymous, unless the context clearly requires otherwise. The processor 1502 may include any type of processors, such as a CPU, a microprocessor, and the like. The processor 1502 may be implemented as an integrated circuit having multi-cores, e.g., a multi-core microprocessor. The computing device 1500 may include mass storage devices 1506 (such as diskette, hard drive, volatile memory (e.g., dynamic random access memory (DRAM), compact disc read-only memory (CD-ROM), digital versatile disk (DVD), and so forth)). In general, system memory 1504 and/or mass storage devices 1506 may be temporal and/or persistent storage of any type, including, but not limited to, volatile and non-volatile memory, optical, magnetic, and/or solid state mass storage, and so forth. Volatile memory may include, but is not limited to, static and/or DRAM. Non-volatile memory may include, but is not limited to, electrically erasable programmable ROM, phase change memory, resistive memory, and so forth. In some embodiments, one or both of the system memory 1504 or the mass storage device 1506 may include computational logic 1522, which may be configured to implement or perform, in whole or in part, one or more instructions that may be stored in the system memory 1504 or the mass storage device 1506. In other embodiments, the computational logic 1522 may be configured to perform a memory-related command such as a read or write command on the system memory 1504 or the mass storage device 1506.

The computing device 1500 may further include input/output (I/O) devices 1508 (such as a display (e.g., a touchscreen display), keyboard, cursor control, remote control, gaming controller, image capture device, and so forth) and communication interfaces 1510 (such as network interface cards, modems, infrared receivers, radio receivers (e.g., Bluetooth), and so forth).

The communication interfaces 1510 may include communication chips (not shown) that may be configured to operate the device 1500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 1510 may operate in accordance with other wireless protocols in other embodiments.

The computing device 1500 may further include or be coupled with a power supply. The power supply may, for example, be a power supply that is internal to the computing device 1500 such as a battery. In other embodiments the power supply may be external to the computing device 1500. For example, the power supply may be an electrical source such as an electrical outlet, an external battery, or some other type of power supply. The power supply may be, for example alternating current (AC), direct current (DC) or some other type of power supply. The power supply may in some embodiments include one or more additional components such as an AC to DC convertor, one or more downconverters, one or more upconverters, transistors, resistors, capacitors, etc. that may be used, for example, to tune or alter the current or voltage of the power supply from one level to another level. In some embodiments the power supply may be configured to provide power to the computing device 1500 or one or more discrete components of the computing device 1500 such as the processor(s) 1502, mass storage 1506, I/O devices 1508, etc.

The above-described computing device 1500 elements may be coupled to each other via system bus 1512, which may represent one or more buses. In the case of multiple buses, they may be bridged by one or more bus bridges (not shown). Each of these elements may perform its conventional functions known in the art. The various elements may be implemented by assembler instructions supported by processor(s) 1502 or high-level languages that may be compiled into such instructions.

The permanent copy of the programming instructions may be placed into mass storage devices 1506 in the factory, or in the field, through, for example, a distribution medium (not shown), such as a compact disc (CD), or through communication interface 1510 (from a distribution server (not shown)). That is, one or more distribution media having an implementation of the agent program may be employed to distribute the agent and to program various computing devices.

The number, capability, and/or capacity of the elements 1508, 1510, 1512 may vary, depending on whether computing device 1500 is used as a stationary computing device, such as a set-top box or desktop computer, or a mobile computing device, such as a tablet computing device, laptop computer, game console, or smartphone. Their constitutions are otherwise known, and accordingly will not be further described.

In various implementations, the computing device 1500 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 1500 may be any other electronic device that processes data.

In some embodiments, as noted above, computing device 1500 may include one or more of packages 100-300. For example, in some embodiments the die 125 may be an element of the computing device such as a processor 1502, a memory 1504, etc. In this embodiment, the element of the computing device may be thermally or physically coupled with an IHS by a STIM with a dopant as described herein.

Examples of Various Embodiments

Example 1 includes a microelectronic package comprising: a die; a solder thermal interface material (STIM) physically and thermally coupled with the die, wherein the STIM includes: indium; and greater than 0% and less than 5% by weight of another material; and an integrated heat spreader (IHS) physically and thermally coupled with the S TIM, wherein the STIM is physically located between the IHS and the die.

Example 2 includes the microelectronic package of example 1, wherein the material is to improve wettability of the indium to its own intermetallic.

Example 3 includes the microelectronic package of example 2, wherein the material includes bismuth or silver.

Example 4 includes the microelectronic package of example 1, wherein the material is to reduce the tendency of the STIM to deform under stress.

Example 5 includes the microelectronic package of example 4, wherein the material includes bismuth.

Example 6 includes the microelectronic package of example 1, wherein the material is to inhibit intermetallic growth of the STIM during thermal cycling of the microelectronic package.

Example 7 includes the microelectronic package of example 6, wherein the material includes cobalt or a combination of cerium and oxygen such as CeO2.

Example 8 includes the microelectronic package of example 6, wherein the material is to act as a diffusion barrier for the intermetallic growth.

Example 9 includes a microelectronic package comprising: a die coupled with a package substrate; and a solder thermal interface material (STIM) physically and thermally coupled with the die, wherein the STIM includes: indium; and a dopant material that includes silver, bismuth, cobalt, or CeO2.

Example 10 includes the microelectronic package of example 9, further comprising an integrated heat spreader (IHS) physically and thermally coupled with the STIM.

Example 11 includes the microelectronic package of example 9, wherein the STIM includes less than 5% by weight of the dopant material.

Example 12 includes the microelectronic package of any of examples 9-11, wherein the bismuth is to improve wettability of the indium to its own intermetallic or reduce the tendency of the STIM to deform under stress.

Example 13 includes the microelectronic package of any of examples 9-11, wherein the silver is to improve wettability of the indium to its own intermetallic.

Example 14 includes the microelectronic package of any of examples 9-11, wherein the cobalt is to inhibit intermetallic growth of the STIM during thermal cycling of the microelectronic package or to act as a diffusion barrier.

Example 15 includes the microelectronic package of any of examples 9-11, wherein the CeO2 is to inhibit intermetallic growth of the STIM during thermal cycling of the microelectronic package.

Example 16 includes a method of forming a microelectronic package that includes a solder thermal interface material (STIM), wherein the method comprises: positioning a die; placing the STIM on a face of the die, wherein the STIM includes indium and another material such as a dopant material; and placing an integrated heat spreader (IHS) on the STIM such that the STIM is positioned between the die and the IHS.

Example 17 includes the method of example 16, wherein the STIM includes less than 5% by weight of the dopant material.

Example 18 includes the method of example 16, wherein the material includes silver, bismuth, cobalt, or a combination of cerium and oxygen such as CeO2.

Example 19 includes the method of any of examples 16-18, wherein placing the STIM on the face of the die includes placing a preform that includes the STIM on the face of the die, and wherein the material is intermixed with the indium within the preform.

Example 20 includes the method of any of examples 16-18, wherein placing the STIM on the face of the die includes placing a preform that includes the STIM on the face of the die, and wherein the material is arranged as a layer of the preform that is adjacent to a layer of the indium.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:
1. A microelectronic package comprising:
a die;
a solder thermal interface material (STIM), wherein the STIM has a shape that is a polygonal shape or an oval shape, the shape includes an opening, and the STIM includes:
at least 95% by weight indium; and
greater than 0% and less than 5% by weight of another material, wherein the another material includes cobalt;
an integrated heat spreader (IHS), wherein the STIM is between the IHS and the die; and
an intermetallic layer between the STIM and the IHS.

2. The microelectronic package of claim 1, wherein the another material further includes a combination of cerium and oxygen.

3. The microelectronic package of claim 1, wherein the another material further includes bismuth.

4. A microelectronic package comprising:
a die coupled with a package substrate;
an intermetallic layer over the die; and
a solder thermal interface material (STIM) over the intermetallic layer, the STIM thermally coupled with the die and physically coupled with the die by the intermetallic layer, wherein the STIM includes:
indium comprising a majority of the STIM; and
a dopant material comprising cobalt,
wherein the intermetallic layer includes a plurality of grains, wherein the dopant material is at grain boundaries of a first subset of the plurality of grains, and the dopant material is not at grain boundaries of a second subset of the plurality of grains.

5. The microelectronic package of claim 4, further comprising an integrated heat spreader (IHS) physically and thermally coupled with the STIM.

6. The microelectronic package of claim 4, wherein the STIM includes less than 5% by weight of the dopant material.

7. A method of forming a microelectronic package that includes a solder thermal interface material (STIM), wherein the method comprises:
providing a die;
providing the STIM on a face of the die, wherein the STIM has a shape that is a polygonal shape or an oval shape, the shape includes an opening, and the STIM includes at least 95% indium by weight and another material, wherein the another material includes cobalt;
placing an integrated heat spreader (IHS) on the STIM, wherein the STIM is between the die and the IHS; and
forming an intermetallic layer between the STIM and the IHS.

8. The method of claim 7, wherein the STIM includes less than 5% by weight of the material.

9. The method of claim 7, wherein the another material further includes silver, bismuth, or a combination of cerium and oxygen.

10. The method of claim 7, wherein providing the STIM on the face of the die includes placing a preform that includes the STIM on the face of the die, and wherein the another material is intermixed with the indium within the preform.

11. The method of claim 7, wherein providing the STIM on the face of the die includes placing a preform that includes the STIM on the face of the die, and wherein the another material is arranged as a layer of the preform that is adjacent to a layer of the indium.

12. The microelectronic package of claim 1, wherein the another material further includes silver.

13. The microelectronic package of claim 1, wherein the intermetallic layer is a layer that includes a plurality of grains.

14. The microelectronic package of claim 13, further comprising a second intermetallic layer between the die and the STIM.

15. The microelectronic package of claim 4, wherein the STIM has a polygonal shape or an oval shape, and wherein the shape of the STIM includes an opening.

16. The microelectronic package of claim 1, wherein the STIM surrounds the opening.

17. The microelectronic package of claim 1, wherein the intermetallic layer comprises an intermixture of indium, cobalt, and a material of the IHS.

18. The microelectronic package of claim 15, wherein the STIM surrounds the opening.

19. The microelectronic package of claim 1, wherein the intermetallic layer comprises a plurality of grains, the another material is within a first subset of the plurality of grains, and the another material is not within a second subset of the plurality of grains.

20. The microelectronic package of claim 1, wherein the another material is unevenly distributed between different grains of the intermetallic layer.

* * * * *